United States Patent [19]
Shim et al.

[11] Patent Number: 5,854,741
[45] Date of Patent: Dec. 29, 1998

[54] UNIT PRINTED CIRCUIT BOARD CARRIER FRAME FOR BALL GRID ARRAY SEMICONDUCTOR PACKAGES AND METHOD FOR FABRICATING BALL GRID ARRAY SEMICONDUCTOR PACKAGES USING THE SAME

[75] Inventors: Il Kwon Shim, Seoul; Young Wook Heo, Kyungki-Do, both of Rep. of Korea

[73] Assignees: AMKOR Electronics, Inc., Chandler, Ariz.; ANAM Industrial Co., Ltd., Seoul, Rep. of Korea

[21] Appl. No.: 651,200

[22] Filed: May 17, 1996

[30] Foreign Application Priority Data

Nov. 17, 1995 [KR] Rep. of Korea ................ 1995 41846

[51] Int. Cl.[6] ...................................... H05K 7/20
[52] U.S. Cl. ..................... 361/813; 361/707; 361/709; 361/717; 361/718; 361/723; 361/808; 257/675; 257/676; 257/707; 257/713; 174/52.1; 174/52.4; 438/107; 438/111; 438/113; 438/122; 438/458; 438/464; 29/827
[58] Field of Search .................... 361/704, 707, 361/709, 712, 717–723, 761, 764, 808, 813; 257/666, 668, 670, 672, 675, 676, 700, 705, 706, 707, 712, 713, 723, 724; 174/16.3, 52.1, 52.4, 52.6; 438/107, 111, 112, 113, 122, 123, 458, 464; 29/827, 829; 165/80.2, 80.3, 185

[56] References Cited

U.S. PATENT DOCUMENTS

| | | | |
|---|---|---|---|
| 4,691,225 | 9/1987 | Murakami et al. | 257/707 |
| 5,473,514 | 12/1995 | Nagano | 257/672 |
| 5,583,378 | 12/1996 | Marrs et al. | 257/712 |
| 5,614,443 | 3/1997 | Nakashima et al. | 29/877 |
| 5,671,531 | 9/1997 | Mugiya | 29/827 |

Primary Examiner—Leo P. Picard
Assistant Examiner—John B. Vigushin
Attorney, Agent, or Firm—Skjerven Morrill MacPherson Franklin & Friel LLP; Thomas S. MacDonald

[57] ABSTRACT

A unit printed circuit board (PCB) carrier frame used in the fabrication of a heat sink-attached ball grid array (BGA) semiconductor packages and a method for BGA semiconductor packages using the unit PCB carrier frame. The unit PCB carrier frame has a plurality of die pads each defined at its peripheral edges by elongated slots formed at a strip or reel-shaped frame member. For the fabrication of heat sink-attached BGA semiconductor packages, unit PCBs are bonded to the die pads of the unit PCB carrier frame. Accordingly, the bending of the packages is minimized even when they pass through subsequent processes requiring a high temperature. As a result, it is possible to obtain a maximum number of unit PCBs from a PCB panel, thereby achieving an improvement in productivity.

10 Claims, 2 Drawing Sheets

UNIT PRINTED CIRCUIT BOARD CARRIER FRAME FOR BALL GRID ARRAY SEMICONDUCTOR PACKAGES AND METHOD FOR FABRICATING BALL GRID ARRAY SEMICONDUCTOR PACKAGES USING THE SAME

BACKGROUND OF THE INVENTION

1. Field of the Invention

The present invention relates to a unit printed circuit board (PCB) carrier frame used in the fabrication of a heat sink-attached ball grid array (BGA) semiconductor packages, and more particularly to a unit PCB carrier frame in which unit PCBs are individually bonded to die pads, serving as heat sinks, each defined at its peripheral edges by elongated slots formed at a strip or reel-shaped frame member, and a method for fabricating heat sink-attached BGA semiconductor packages using the unit PCB carrier frame.

2. Description of the Prior Art

FIG. 1 illustrates a typical heat sink-attached BGA. As shown in FIG. 1, the BGA, which is denoted by the reference numeral 1, includes a printed circuit board (PCB) 10 on which a semiconductor chip 40 is mounted. A cavity 14 is provided at the PCB portion 10. A heat sink 30 is attached to the lower surface of the PCB 10 such that its upper surface is partially exposed through the cavity 14. The semiconductor chip 40 is directly attached to the exposed upper surface portion of the heat sink 30. The semiconductor chip 40 is electrically connected to the PCB 10. This electrical connection is achieved by electrically connecting bonding pads (not shown) formed at the semiconductor chip 40 to electrically conductive traces formed at the upper surface of the PCB 10 by means of electrically conductive bonding wires 15 respectively. A sealant 16 such as epoxy resin is molded on the semiconductor chip 40 and its peripheral area including the cavity 14 in order to not only protect the bonding wires from environments, but also relieve stress and strains resulting from a relatively high difference in the thermal expansion coefficient between the semiconductor chip 40 and PCB 10. A plurality of solder balls 50 adapted to be used as input/output terminals are deposited on the upper surface of the PCB 10 opposite to the surface to which the heat sink 30 is attached. This semiconductor package having the above construction can effectively discharge heat generated during the operation of the semiconductor chip 40 by the function of the heat sink 30.

Now, a conventional method for fabricating the heat sink-attached BGA semiconductor package 1 will be described in conjunction with FIG. 2. As shown in FIG. 2, a PCB panel 11 is first prepared, and a required circuit and cavities 14 are formed on the PCB panel 11. Thereafter, the PCB panel 11 is attached at its lower surface with a heat sink 30 having the same size as the PCB panel 11 by means of epoxy resin or bonding tapes using a high temperature and pressure press. The PCB panel 11 attached with the heat sink 30 is then cut to form PCB strips 12 each having a desired size. Such PCB strips 12 are used to efficiently carry out a subsequent assembling process involving the attachment of semiconductor chips 40 and the molding of sealant. BGA semiconductor package strips (not shown) fabricated by the subsequent assembling process are cut into unit packages each carrying one semiconductor chip. Thus, BGA semiconductor packages 1 are obtained.

In accordance with the conventional method, however, the PCB strips are repeatedly placed in high temperature environments because they are formed by cutting the PCB panel 11 laminated on the heat sink 30 using the high temperature and pressure press and subsequently treated at a high temperature for the molding of sealant. As a result, the PCB strips are subjected to stress and strains resulting from the relatively high difference in the thermal expansion coefficient between the PCB panel 11 made of bismaleimide triazine and the heat sink 30 made of a metal such as copper alloy or aluminum. As the BGA semiconductor package assembling process repeatedly requiring a high temperature progresses, the PCB strips 12 exhibits an increased bending. This results in a difficulty or impossibility to perform subsequent processing steps.

Since the BGA semiconductor package 1 uses the solder balls 50 as its input/output terminals, it may degrade unless the coplanarity of the solder balls 50 is high (over 6 mil). In this connection, the conventional PCB strips 12 are likely to be bent, thereby causing the solder balls 50 deposited thereon to have a degraded coplanarity. For this reason, the conventional BGA semiconductor package involves a degradation in quality.

As mentioned above, the conventional PCB strips 12 are formed by cutting the PCB panel 11 bonded with the heat sink 30 into strip-shaped pieces. However, it is impossible to use PCB strips prepared by cutting portions of the PCB panel 11 which are bent beyond a predetermined limitation upon bonding the heat sink 30 to the PCB panel 11 by the high temperature and pressure press. Consequently, the conventional method involves a low productivity.

SUMMARY OF THE INVENTION

Therefore, an object of the invention is to solve the above-mentioned problems encountered in the prior art and to provide a unit PCB carrier frame for BGA semiconductor packages in which unit PCBs are individually bonded to die pads, serving as heat sinks, each defined at its peripheral edges by elongated slots formed at a strip or reel-shaped frame member so as to obtain BGA semiconductor packages having a good quality, and a method for fabricating heat sink-attached BGA semiconductor packages using the unit PCB carrier frame, which involves cutting tie bars of a continuous BGA semiconductor package assembly fabricated using the unit PCB carrier frame, thereby fabricating BGA semiconductor packages at a high productivity.

In accordance with one aspect, the present invention provides a unit printed circuit board carrier frame for ball grid array semiconductor packages comprising: a plurality of die pads each bonded with a unit printed circuit board (PCB); a frame member adapted to support the die pads at peripheral edges of the die pads; elongated slots provided at the frame member and adapted to define the peripheral edges of each die pad such that the die pad corresponds in shape to each unit PCB; and tie bars adapted to connect each die pad to the frame member such that the die pad is supported to the frame member.

In accordance with another aspect, the present invention provides a method for fabricating ball grid array semiconductor packages, comprising the steps of: forming a circuit pattern and cavities at required portions of a PCB panel; cutting the patterned PCB panel into unit PCBs; bonding the unit PCBs respectively to die pads of a unit PCB carrier frame, which includes the die pads, a frame member adapted to support the die pads at peripheral edges of the die pads, elongated slots provided at the frame member and adapted to define the peripheral edges of each die pad such that the die pad corresponds in shape to each unit PCB, tie bars adapted to connect each die pad to the frame member such that the die pad is supported by the frame member, thereby forming a continuous semiconductor package assembly; and cutting the tie bars in the continuous semiconductor package assembly.

For the fabrication of heat sink-attached BGA semiconductor packages, unit PCBs are bonded to the die pads of the unit PCB carrier frame. Accordingly, the bending of the packages is minimized even when they pass through subsequent processes requiring a high temperature. As a result, it is possible not only to improve the quality of the BGA array semiconductor packages, but also to achieve an improvement in the productivity and process efficiency.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1:
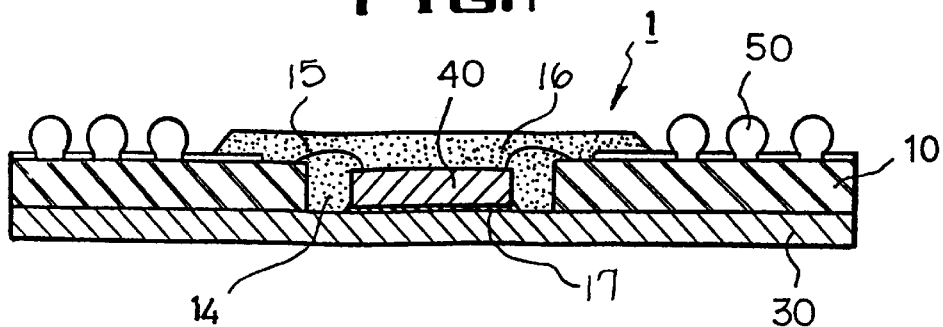
FIG. 1 is a sectional view illustrating a typical heat sink-attached BGA semiconductor package.
Figure 2:
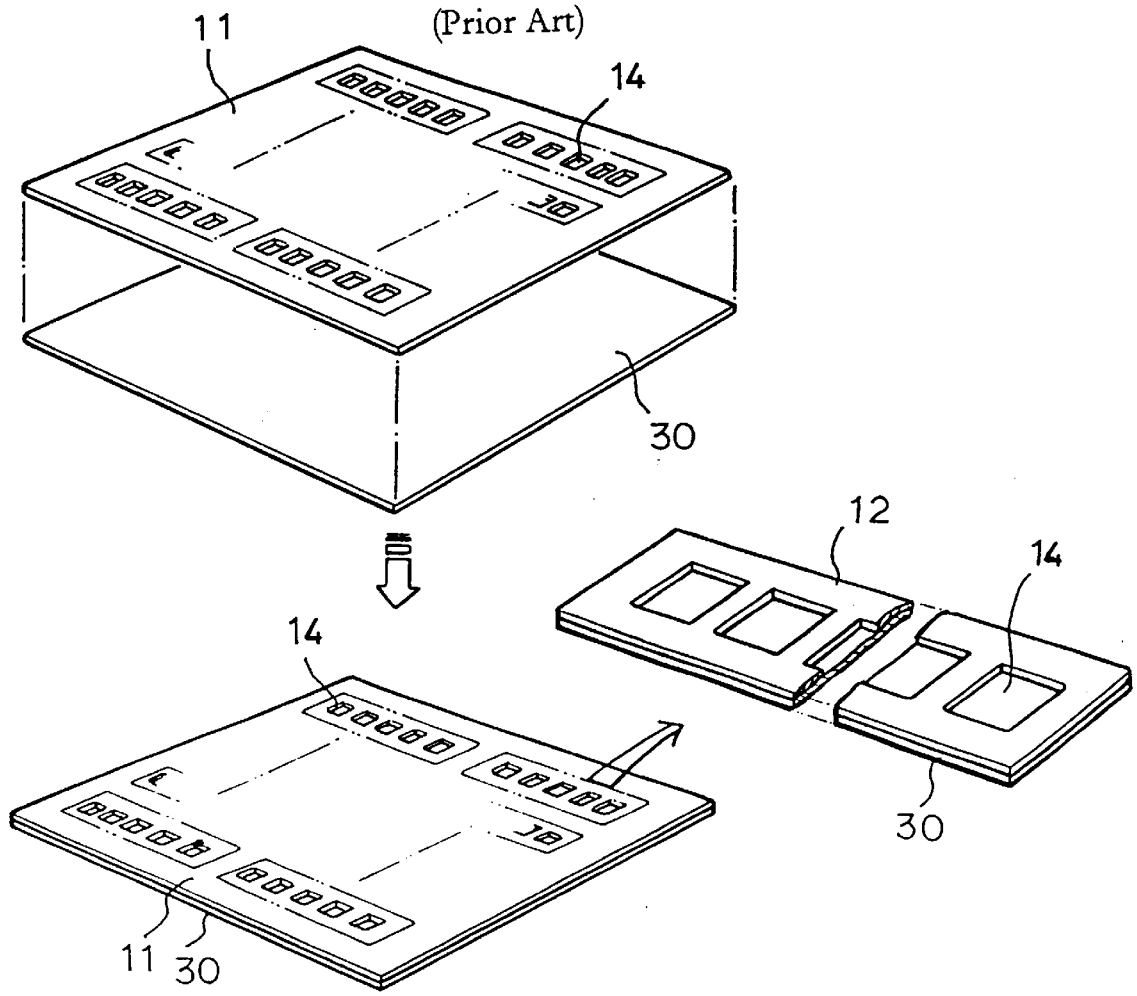
FIG. 2 is a view illustrating a method for fabricating a conventional heat sink-attached PCB strip.
Figure 3:
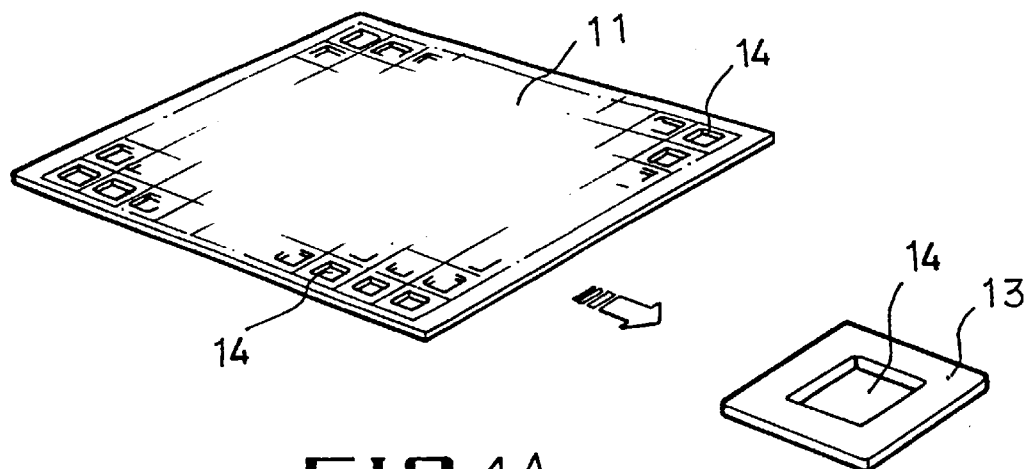
FIG. 3 is a view illustrating a method for fabricating a unit PCB according to the present invention.

FIG. 3 illustrates a method for fabricating a unit PCB according to the present invention. In FIG. 3, elements respectively corresponding to those in FIGS. 1 and 2 are denoted by the same reference numerals.

As shown in FIG. 3, a PCB panel 11 is first prepared, and a required circuit pattern (not shown) and cavities 14 are formed on the PCB panel 11. Thereafter, the patterned PCB panel 11 is cut into pieces each having a desired size to form unit PCBs 13 adapted to be used for packages. Each unit PCB 13 is provided with a cavity 14 for mounting a semiconductor chip 40 thereon. Although it is typical that each unit PCB 13 has one cavity, it may have more cavities.

Figure 4A:
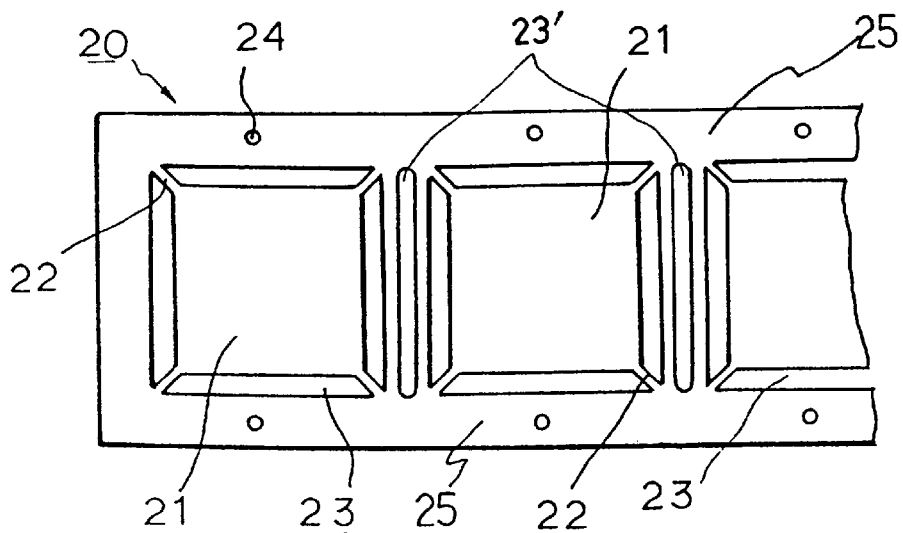
FIG. 4A is a plan view illustrating a unit PCB carrier frame according to the present invention.

FIG. 4A is a plan view illustrating a unit PCB carrier frame according to the present invention. As shown in FIG. 4A, the unit PCB carrier frame, which is denoted by the reference numeral 20, includes a frame member 25, a plurality of die pads 21 and a plurality of tie bars 22. The die pads 21 serve as heat sinks in a finally fabricated package 1.

The die pads 21 provided at the unit PCB carrier frame 20 according to the present invention provide areas on which unit PCBs 13 are mounted, respectively. Each die pad 21 is provided with elongated slots 23 for defining peripheral edges of the die pad 21 such that the die pad 21 corresponds in shape to the unit PCB 13. Although four slots 23 having the same shape and size are provided for each die pad 21 in the case illustrated in FIG. 4A, the number and position of such slots may be appropriately selected without being limited thereto. A longitudinally extending additional slot 23' is formed between adjacent slots 23 of adjacent die pads 21. Each die pad 21 is connected and supported to the frame member 25 by tie bars 22 each disposed between facing ends of adjacent slots 23. The shape and position of tie bars 22 are not limited to the illustrated case. The shape and position of tie bars 22 may be variable in so far as the portion of each die pad 21 corresponding to each tie bar can separate easily from the frame member 25 by means of cutting.

In the unit PCB carrier frame 20, the slots 23 and 23', which define the peripheral edges of each die pad 21, serve to prevent the unit PCB carrier frame 20 from being bent in the package assembling at a high temperature. The frame member 25, which has a rectangular shape, may be provided with a plurality of spaced holes 24. These holes 24 serve as means for feeding the unit PCB carrier frame 20 and setting it at an accurate position.

Preferably, the unit PCB carrier frame 20 according to the present invention is made of a metal exhibiting a high thermal conductivity. Such a metal includes copper, copper alloy, aluminum or stainless steel. After assembling the unit PCB carrier frame 20 into a package strip or reel, tie bars 22 are cut, thereby obtaining individual BGA semiconductor packages 1. In each BGA semiconductor package 1, the die pad 21 serves as a heat sink.

The die pads 21 provided at the unit PCB carrier frame 20 are coated with an oxide thin film by an anodizing treatment in order to increase the bonding strength of each unit PCB 13 mounted on each die pad 21. Where the die pads 21 are made of aluminum, they are coated with a thin film made of $Al_2O_3$. Where the die pads 21 are made of copper alloy, they are coated with a thin film made of an oxide such as $Cu_2O$ or $CuO$.

Preferably, the lower surface of each die pad 21 is plated with nickel or solder to protect the surface from any corrosion and the like.

Taking into consideration the performance of the processing steps, each die pad 21 has a size having a dimensional difference ranging within ±2 mm from the size of the unit PCB 13 mounted thereon.

Figure 4B:
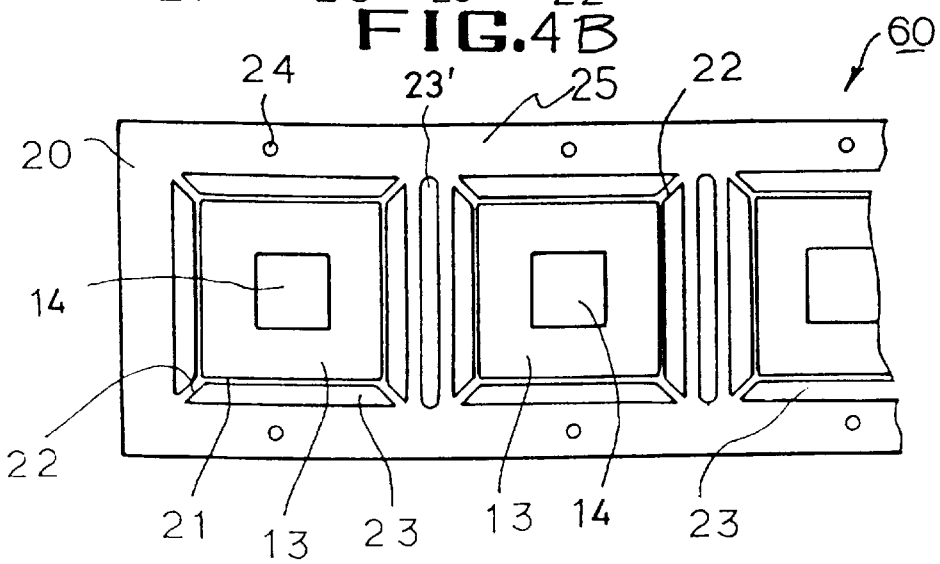
FIG. 4B is a plan view illustrating the unit PCB carrier frame of the present invention, on which a plurality of unit PCBs are mounted.

FIG. 4B is a plan view illustrating the unit PCB carrier frame 20 on which a plurality of unit PCBs 13 are mounted. As shown in FIG. 4B, the unit PCBs 13 are mounted on the die pads 21 of the unit PCB carrier frame 20, respectively. The mounting of the unit PCBs 13 is carried out by bonding semiconductor chips 40 to the die pads 21 by means of a thermal conductive epoxy resin such as silver-filled epoxy or other bonding means such as bonding tapes 17 (as shown in FIG. 1), and then curing the bonding means at a high temperature of 150° C. or above. After curing the bonding means, bond pads (not shown) of each semiconductor chip 40 are electrically connected to lead fingers 16 provided at each associated PCB 13 by Au wires, respectively. The semiconductor chips 40 and their peripheral areas including cavities 14 are sealed by a liquid-phase sealing resin (not shown). The sealing resin is cured at a high temperature. Thereafter, a resin-based flux or water-soluble flux is coated over a surface portion of each PCB 10 on which solder balls 50 will be deposited. The flux serves to achieve an easy deposition of the solder balls 50. The deposition of solder balls 50 is carried out by laying solder balls on the surface portion of each PCB 10 of the unit PCB carrier frame 20, and then passing the unit PCB carrier frame 20 through a furnace being kept at a high temperature of 220° C. or above. Finally, the flux left on the package product is completely removed using a water-soluble rinse or semi-water-soluble rinse. Thus, a continuous semiconductor package having a certain length is obtained.

The unit PCB carrier frame 20, in which unit PCBs 13 are bonded to its die pads 21 in accordance with the present invention, can be applied to conventional assembling processes for fabricating BGA semiconductor packages 1 as it is. In this case, conventional manufacturing equipment can be used as it is. Accordingly, it is possible to reduce the manufacturing cost.

Since each portion of the unit PCB carrier frame 20, on which each unit PCB is mounted, is limited to only each die pad 21 in accordance with the present invention, the unit PCB carrier frame 20 exhibits a minimum bending even when each heat sink 30 (namely, each die pad 21 of the unit PCB carrier frame 20) is bonded with each unit PCB 13 made of a material different from that of the heat sink 30. Accordingly, it is possible to appropriately keep the coplanarity of the solder balls 50 deposited on each unit PCB 13 even when the unit PCB carrier frame 20 passes through subsequent processes requiring a high temperature.

After assembling the unit PCB carrier frame 20 into a continuous package strip or reel, tie bars 22 connecting the die pads 21 to the frame member 25 are simply cut, thereby easily obtaining individual BGA semiconductor packages 1.

Preferably, the unit PCB carrier frame 20 according to the present invention has a strip shape similar to those of conventional lead frames so that it can be applied to existing semiconductor package manufacturing equipment and processes as it is. For continuously performing the processes, the unit PCB carrier frame 20 may also have a reel shape.

As apparent from the above description, the present invention provides a unit PCB carrier frame in which unit PCBs are bonded only to frame portions each corresponding to each die pad, and a method for fabricating heat sink-attached BGA semiconductor packages using the unit PCB carrier frame. Since unit PCBs are bonded only to frame portions each corresponding to each die pad in the unit PCB carrier frame exhibiting a good thermal transfer in accordance with the present invention, the bending of the packages is minimized even when they pass through subsequent processes requiring a high temperature. The performance of the processes is also good. It is also possible to obtain a maximum number of unit PCB's from a PCB panel, thereby achieving an improvement in productivity.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A unit printed circuit board carrier frame for ball grid array semiconductor packages comprising:
    a plurality of die pads functioning as heat sinks each bonded with a unit printed circuit board (PCB);
    a frame member adapted to support the die pads at peripheral edges of the die pads;
    elongated slots provided at the frame member and adapted to define the peripheral edges of each die pad such that the die pad corresponds in shape to each unit PCB;
    tie bars adapted to connect each die pad to the frame member such that the die pad is supported by the frame member.

2. The unit PCB carrier frame in accordance with claim 1, further comprising:
    additional slots each provided at the frame member between adjacent ones of the die pads defined at their peripheral edges by the elongated slots; and
    a plurality of laterally spaced holes provided at the frame member.

3. The unit PCB carrier frame in accordance with claim 1 or 2, wherein the unit PCB carrier frame is made of a metal selected from the group consisting of copper, copper alloy, aluminum and stainless steel.

4. The unit PCB carrier frame in accordance with claim 1, wherein the die pads each has a size having a dimensional difference ranging within ±2 mm from the size of the unit PCB.

5. The unit PCB carrier frame in accordance with claim 1 or 4, wherein the die pads each is coated at its upper surface with a thin film formed by an anodizing treatment or with a thin film made of $Cu_2O$ or $CuO$ to enhance its PCB bonding strength.

6. The unit PCB carrier frame in accordance with claim 1 or 4, wherein the die pads each is plated at its lower surface with nickel or solder to obtain its surface protection.

7. The unit PCB carrier frame in accordance with claim 1 or 2, wherein the frame member has a strip or reel shape.

8. A method for fabricating ball grid array semiconductor packages, comprising the steps of:
    forming a circuit pattern and cavities at required portions of a PCB panel;
    cutting the patterned PCB panel into unit PCBs;
    bonding the unit PCBs respectively to die pads of a unit PCB carrier frame, which includes the die pads, a frame member adapted to support the die pads at peripheral edges of the die pads, elongated slots provided at the frame member and adapted to define the peripheral edges of each die pad such that the die pad corresponds in shape to each unit PCB, tie bars adapted to connect each die pad to the frame member such that the die pad is supported by the frame member, thereby forming a continuous semiconductor package assembly; and
    cutting the tie bars in the continuous semiconductor package assembly.

9. The method in accordance with claim 8, wherein the step of cutting the patterned PCB panel into unit PCBs is carried out such that the unit PCBs include the cavities at their portions on which the semiconductor chips are mounted, respectively.

10. The method in accordance with claim 8, wherein at the bonding step, the unit PCBs are individually bonded to the die pads of the unit PCB carrier frame, and the bonding is carried out using an epoxy-based or polyimide-based bonding film requiring a high temperature and pressure press.

* * * * *